United States Patent
Kihara et al.

(10) Patent No.: US 7,411,333 B2
(45) Date of Patent: Aug. 12, 2008

(54) SURFACE ACOUSTIC WAVE DEVICE

(75) Inventors: Yoshikazu Kihara, Tokyo (JP); Katsunori Osanai, Tokyo (JP); Yukio Hirokawa, Tokyo (JP); Masaki Sobu, Tokyo (JP)

(73) Assignee: TDK Corporation, Tokyo (JP)

( * ) Notice: Subject to any disclaimer, the term of this patent is extended or adjusted under 35 U.S.C. 154(b) by 16 days.

(21) Appl. No.: 11/457,960

(22) Filed: Jul. 17, 2006

(65) Prior Publication Data

US 2007/0018533 A1 Jan. 25, 2007

(30) Foreign Application Priority Data

Jul. 21, 2005 (JP) .............. 2005-211757

(51) Int. Cl.
*H03H 9/145* (2006.01)
*H03H 9/25* (2006.01)
*H01L 41/047* (2006.01)

(52) U.S. Cl. .................. 310/313 B; 310/313 R; 310/358

(58) Field of Classification Search ............. 310/358, 310/313
See application file for complete search history.

(56) References Cited

U.S. PATENT DOCUMENTS 6,426,584 B2 * 7/2002 Yoshida et al. ......... 310/313 A

2006/0103486 A1 * 5/2006 Ruile et al. ............... 333/133
2006/0158800 A1 * 7/2006 Takayama et al. ......... 361/56

FOREIGN PATENT DOCUMENTS

| JP | 9-167936 | 6/1997 |
| JP | 2004-507960 | 3/2004 |
| JP | 2004254114 A * | 9/2004 |

* cited by examiner

*Primary Examiner*—Jaydi A San Martin
(74) *Attorney, Agent, or Firm*—Oblon, Spivak, McClelland, Maier & Neustadt, P.C.

(57) ABSTRACT

A SAW device comprises a single crystal piezo-electric strate (made, for example, of $LiTaO_3$ or $LiNbO_3$), and an interdigital transducer (IDT) formed of a material mainly containing Al and disposed on the piezo-electric substrate. The piezo-electric strate contains an additive (for example, Fe, Mn, Cu, Ti), and an orientation rotated by an angle in a range of 42° to 48° (more preferably 46°±0.3°) from a Y-axis toward a Z-axis about an X-axis. The IDT presents a normalized thickness $h/\lambda$ (h: thickness of electrode, and $\lambda$: spacing between digits of the IDT) of 7% to 11%. A more appropriate substrate cut angle can be shown for the SAW device which employs a piezo-electric substrate containing an additive, to improve the electric characteristics thereof.

8 Claims, 3 Drawing Sheets

SURFACE ACOUSTIC WAVE DEVICE

BACKGROUND OF THE INVENTION

The present invention relates to a surface acoustic wave device, and more particularly, to a substrate cut angle which is suitable for a single crystal piezo-electric substrate to which an additive is added to constitute a surface acoustic wave device.

A surface acoustic wave device (hereinafter called the "SAW device") which utilizes a surface acoustic wave (SAW) generated by a piezo-electric effect is widely applied to portable telephones and other electronic equipment as an electronic device such as a filter, a resonator and the like, because of its small size and light weight as well as high reliability.

The SAW device generally comprises a first electrode which is applied with a high frequency signal to excite a surface acoustic wave, a second electrode which receives the surface acoustic wave propagated thereto after excited by the first electrode, and converts the surface acoustic wave again to an electric signal to extract a signal at a particular frequency, and a piezo-electric substrate on which the first and second electrodes are formed. The SAW device can form part of a signal processing device for extracting a signal at a particular frequency, such as a filter, a resonator, a duplexer and the like.

A variety of proposals have also been made for an angle at which a used piezo-electric substrate is cut such that a resulting filter or resonator exhibits optimal electric characteristics, for example, in JP-A-2004-507960 and JP-A-9-167936.

SUMMARY OF THE INVENTION

The piezo-electric substrate generally exhibits a pyroelectric property as well as a piezo-electric property. The pyroelectric property can cause a non-uniform charge distribution on the surface of the substrate, associated with changes in temperature, to degrade the electric characteristics of a device, or cause a discharge between the electrodes of a miniature interdigital transducer (IDT) due to an accumulated charge, to damage electrode digits and possibly lead to an electrostatic discharge damage.

To overcome such problems caused by the pyroelectric property, a trace of additive such as iron (Fe) may be added to a piezo-electric substrate. The addition of the additive reduces the volume resistivity of the piezo-electric substrate, prevents a charge from accumulating, and improves the pyroelectric property.

However, in a variety of studies on the electric characteristics of SAW devices which used a piezo-electric substrate that included a trace of additive, the inventors found that an optimal cut angle for a substrate containing an additive was different from that for a substrate containing no additive. In other words, for a substrate which contains an additive as mentioned above, it is not appropriate to apply a conventional design approach (for a substrate containing no additive), as it is, in regard to the substrate cut angle, but the substrate containing an additive should be cut at a preferred cut angle inherent thereto. Accordingly, SAW devices which employ a substrate containing an additive still leave room for further improving the electric characteristics in this regard.

It is therefore an object of the present invention to provide a more appropriate cut angle for a SAW device which employs an piezo-electric substrate that contains an additive, to further improve the electric characteristic of the SAW device.

To solve the problem mentioned above and achieve the object, a SAW device according to the present invention comprises a single crystal piezo-electric substrate, and an interdigital electrode transducer (IDT) formed of a material mainly containing aluminum (Al or Al alloy) and disposed on the surface of the piezo-electric substrate, wherein the single crystal piezo-electric substrate contains an additive, and has an orientation rotated by an angle in a range of 42° to 48° (more preferably, 46°±0.3°) from a Y-axis toward a Z-axis about an X-axis.

When a SAW device (for example, a SAW filter) is fabricated using a piezo-electric substrate which contains an additive, the piezo-electric substrate cut at an angle as mentioned above can result in the realization of the SAW device which exhibits favorable electric characteristics with a high Q-value and a low insertion loss in a pass band. In this respect, a detailed description will be given in DESCRIPTION OF THE EMBODIMENTS, later described, based on the result of measurements (FIGS. 3 to 5).

The piezo-electric substrate is typically a lithium tantalate ($LiTaO_3$, hereinafter abbreviated as LT) substrate or a lithium niobate ($LiNbO_3$, hereinafter abbreviated as LN) substrate. However, the piezo-electric substrate is not limited to these particular materials, but may be a piezo-electric substrate made of quartz or the like.

The additive, on the other hand, maybe iron (Fe), manganese (Mn), copper (Cu), and titanium (Ti), by way of example. Two or more of these elements may be contained in the piezo-electric substrate. Among others, Fe is particularly preferable because it is prone to uniform mixture into the piezo-electric substrate (LT, LN), and provides a good crystal quality. It should be noted that when Fe is used as the additive, the additive is preferably added at weight percentage of 1.24 wt % or lower. In this event, a resulting piezo-electric substrate has a volume resistivity of $3.6 \times 10^{10} \Omega \cdot cm$ or higher. The added Fe at weight percentage exceeding 1.24 wt % would cause an excessive reduction in the volume resistivity of the piezo-electric substrate, resulting in the substrate made more conductive, short-circuiting of electrode digits of an interdigital transducer to each other, and degraded electric characteristics.

Since a piezo-electric substrate generally has a pyroelectric property as well as a piezo-electric property, a non-uniform charge distribution can appear on the surface of the piezo-electric substrate due to changes in temperature. As such, there is a concern that this charge, if accumulating on the substrate, would give rise to degraded characteristics during manufacturing of the SAW device and during actual use after the SAW device has been mounted on a variety of electronic equipment, and to damages to electrodes due to a discharge in the interdigital transducer. In contrast, if an additive such as Fe is added to a piezo-electric substrate as mentioned above, the volume resistance of the substrate is reduced, thus making it possible to manufacture a SAW device which avoids the foregoing problems and excels in reliability. Moreover, when the cut angle of the substrate is set within the aforementioned range in accordance with the present invention, the resulting SAW device will excel in the electric characteristics.

While the addition of an additive as mentioned above can improve the pyroelectric property, the present invention does not limit the purpose of adding the additive only to the improvement of the pyroelectric property. In other words, even if an additive is added to a substrate for other purposes than the improvement of the pyroelectric property, the substrate which contains the additive as a result should fall under the piezo-electric substrate as defined in the present invention. This is because even such a substrate is the same in that it contains the additive, and if the substrate is cut at the aforementioned cut angle proposed by the present invention, the substrate likewise provides favorable electric characteristics intended by the present invention.

As to outer dimensions of the interdigital transducer (IDT) formed on the surface of the piezo-electric substrate, the interdigital transducer is preferably designed such that a normalized thickness h/λ thereof, for example, lies on the order of 7 to 11% (h/λ≈0.07-0.11), where the normalized thickness h/λ is a value derived by normalizing the thickness h of the interdigital transducer by the spacing λ between digits of the electrodes. However, the outer dimensions of the interdigital transducer in the present invention is not necessarily limited to the foregoing range, but h/λ may take another value (for example, h/λ=1%-15%).

The SAW device of the present invention includes a variety of devices which utilize a surface acoustic wave generated on a piezo-electric substrate, for example, a SAW resonator which includes an interdigital transducer or a reflector and the interdigital transducer, a SAW filter, a SAW duplexer and the like.

According to the present invention, a more appropriate substrate cut angle can be proposed for a SAW device which is manufactured using a piezo-electric substrate to which an additive has been added, so that the resulting SAW device can exhibit favorable electric characteristics (a high Q, a low insertion loss, and the like).

BRIEF DESCRIPTION OF THE DRAWINGS

Other objects, features, and advantages of the present invention will become more apparent from the following description of embodiments of the present invention. However, it should be apparent to those skilled in the art that the present invention is not limited to such embodiments, but a variety of modifications can be made thereto within the scope as defined by appended claims.

DESCRIPTION OF THE EMBODIMENTS

Figure 1:
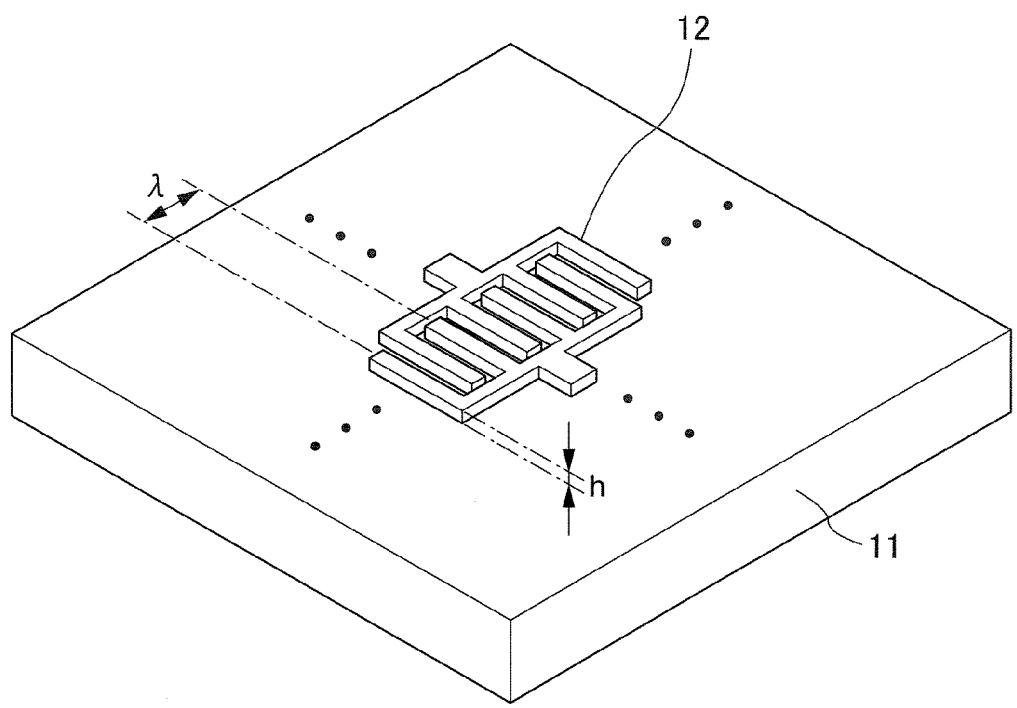
FIG. 1 is a schematic diagram illustrating a SAW device according to one embodiment of the present invention.

FIG. 1 is a schematic diagram illustrating a SAW device according to one embodiment of the present invention. As illustrated in FIG. 1, the SAW device comprises an interdigital transducer (made up of interdigital electrodes) 12 formed on the surface of a LT (LiTaO$_3$) single crystal substrate 11. A trace of additive, i.e., Fe by way of example, is added to the LT substrate 11. For adding Fe to the LT substrate 11, Fe may be added to a melted LT material in course of producing a single crystal which forms a substrate (wafer), for example, in the Czochralski process.

The added Fe causes a reduction in the volume resistivity of the LT substrate 11. In this event, the amount of added Fe is preferably adjusted such that the volume resistivity of the LT substrate 11 falls within a range of $3.6 \times 10^{10}$ to $1.5 \times 10^{14}$ Ω·cm. This is because the volume resistivity equal to or lower than $1.5 \times 10^{14}$ Ω·cm will prevent a charge from accumulating on the LT substrate 11 to avoid damages to the interdigital transducer 12 due to a discharge, and an electrostatic discharge damage, while the volume resistivity equal to or higher than $3.6 \times 10^{10}$ Ω·cm will prevent electrode digits of the interdigital transducer 12 from short-circuiting to each other.

Figure 2:
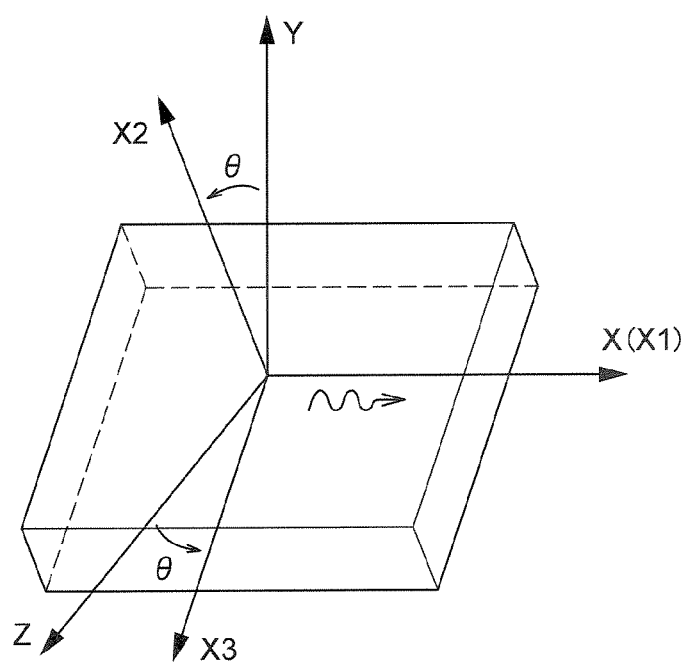
FIG. 2 is a conceptual diagram for describing a cut angle for a single crystal piezo-electric substrate.

FIG. 2 is a conceptual diagram illustrating a cut angle for an LT substrate, showing that an LT single crystal having crystal axes X, Y, Z is cut at an angle rotated by a rotating angle θ from the Y-axis toward the Z-axis about the crystal axis X. Assuming that such a single crystal piezo-electric substrate is called the "θ-rotation Y-X substrate," this embodiment employs a substrate with θ set to 46°, i.e., the LT substrate 11 which is 46°-rotation Y-X substrate. It should be noted that manufacturing errors (tolerance) are included in actual fabrication, so that θ equal to 46°, described in this embodiment, includes a range of angles 46°±0.3°(45.7°≦θ≦46.3°). The angle θ is set at 46° in this embodiment based on the following reason.

Figure 3:
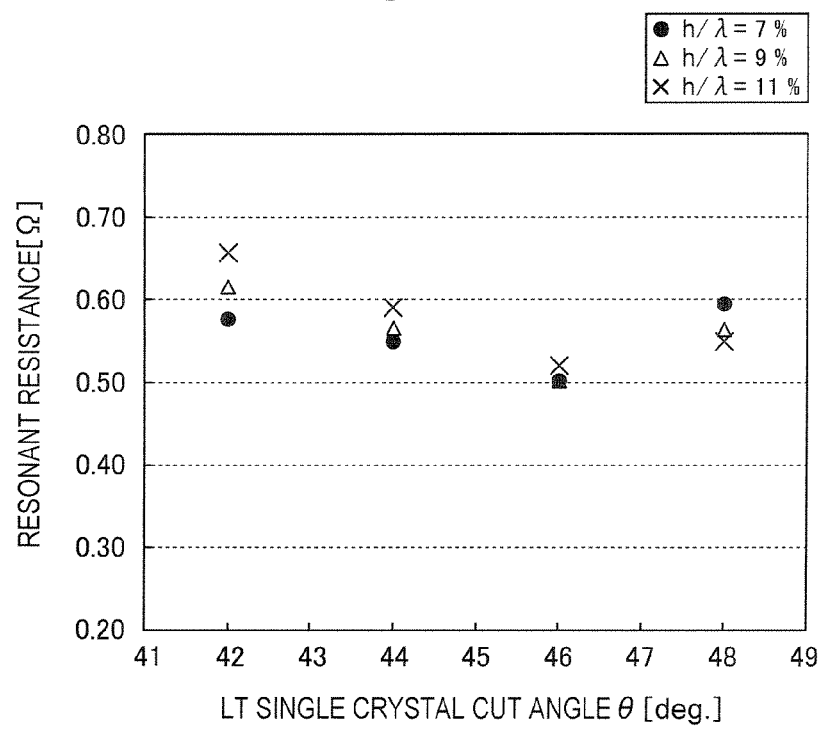
FIG. 3 is a graph showing the relationship between a cut angle for a LiTaO$_3$ single crystal substrate, to which Fe is added as an additive, and a resonant resistance.
Figure 4:
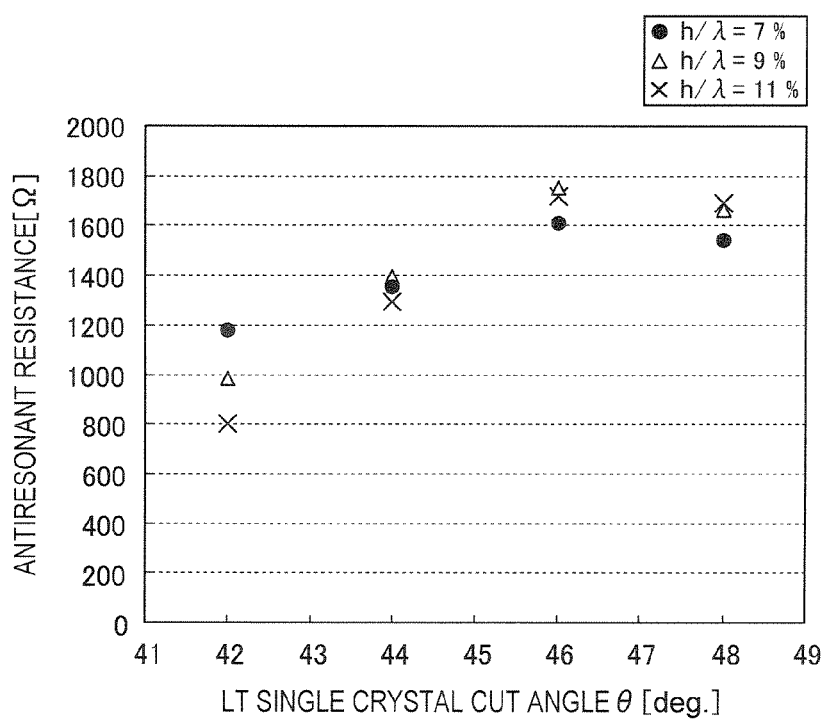
FIG. 4 is a graph showing the relationship between the cut angle for a LiTaO$_3$ single crystal substrate, to which Fe is added as an additive, and an antiresonant resistance.
Figure 5:
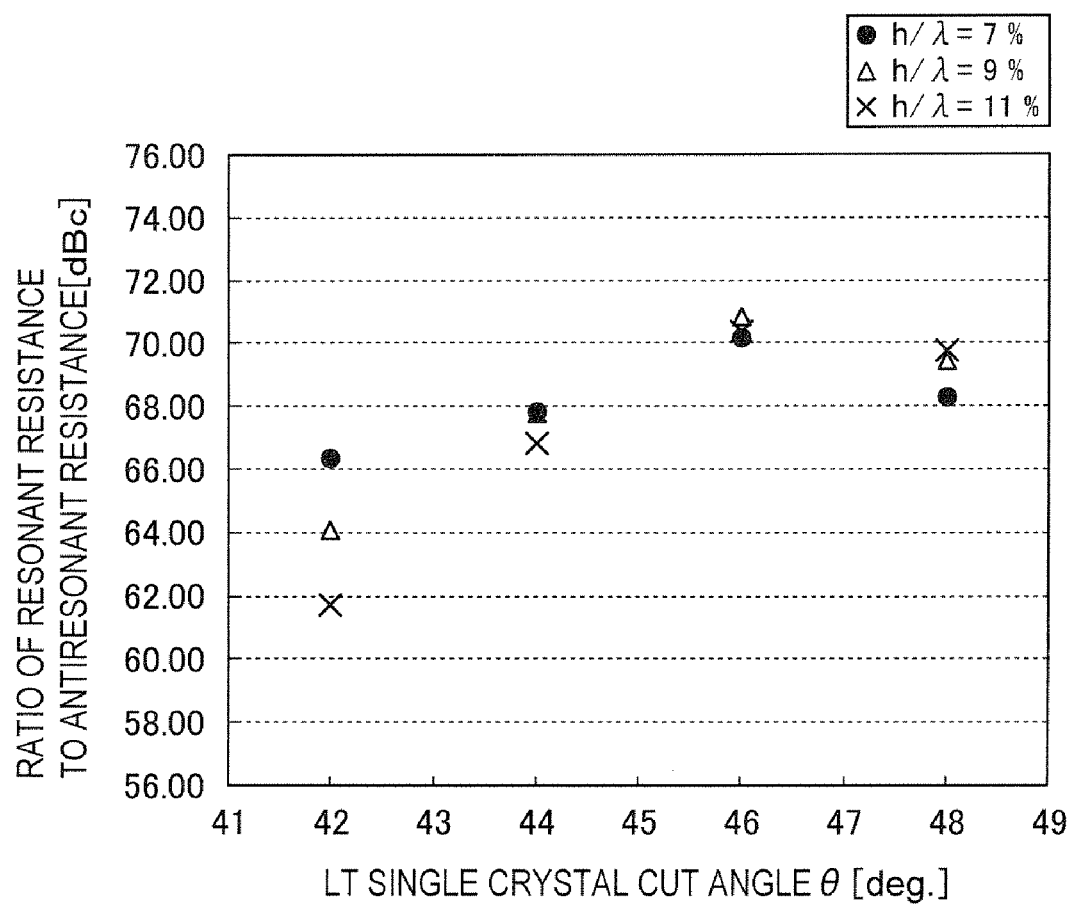
FIG. 5 is a graph showing the relationship between the cut angle for a LiTaO$_3$ single crystal substrate, to which Fe is added as an additive, and a ratio of the resonant resistance to the antiresonant resistance.

FIG. 3 shows the relationship between the substrate cut angle θ and a resonant resistance value of a resonator which is formed on a θ-rotation Y-X substrate made of LT single crystal and containing Fe as an additive; FIG. 4 shows the relationship between the substrate cut angle θ and an antiresonant resistance value; and FIG. 5 shows the relationship between the substrate cut angle θ and the ratio of the resonant resistance to the antiresonant resistance. The resonator (IDT) used in measurements had electrodes made of Al, and the normalized thickness h/λ of the electrodes was set to 7%, 9%, and 11% (h represents the thickness of the electrodes, and the spacing between the electrode digits). In the graphs shown in FIGS. 3 to 5, "●" indicates when h/λ=7%; "△" when h/λ=9%; and "×" when h/λ=11%, respectively.

As is apparent from these graphs, it has been found that for the LT single crystal substrate which contains Fe, the lowest resonant resistance as well as the highest antiresonant resistance and ratio of resonant resistance to antiresonant resistance can be achieved when the substrate cut angle θ is 46°, as compared with 42°,44° and 48°. Accordingly, in the Saw device of this embodiment, a particularly preferred exemplary substrate cut angle θ is chosen to be 46°. In this way, a SAW resonator which excels in the electric characteristics (a high Q and a low insertion loss) can be formed on the surface of the LT single crystal substrate which contains Fe.

Also, in regard to the normalized thickness h/λ of the electrodes, h/λ set at 9% is particularly preferred, but not so limited, because it results in the lowest resonant resistance and the highest antiresonant resistance and ratio of the resonant resistance to the antiresonant resistance.

While the interdigital transducer (IDT) 12 is formed of Al, it may be formed of an Al alloy as well. The dimensions of the IDT electrodes are determined to set the normalized thickness h/λ in a range of 7% to 11%, other values (for example, 1% to 15%) can also be employed for h/λ. Though not shown in FIG. 1, the substrate 11 is provided, on the surface thereof, with a reflector, conductor lines, input/output electrode pads and the like, other than the IDT 12. Further, a plurality of resonators can be formed on the LT substrate 11 to make up a SAW filter, a SAW duplexer or the like, wherein a variety of designs can be employed for a connection structure of each resonator, arrangement and structure of the IDT electrodes, and the like, so that the resonators are not limited to any particular structure.

What is claimed is:

1. A surface acoustic wave device comprising:
  a single crystal piezo-electric substrate; and an interdigital transducer formed of a material mainly containing aluminum and disposed on a surface of said piezo-electric substrate, wherein said single crystal piezo-electric substrate contains an additive, and has an orientation rotated by an angle in a range of 42° to 48° from a Y-axis to a Z-axis about an X-axis, said piezo-electric substrate is a lithium tantalate substrate or a lithium niobate substrate, and said additive comprising iron, added at a weight percentage of 1.24 wt. % or less, said interdigital transducer presents a normalized thickness h/λ in a range of 7 to 11 %, said normalized thickness being derived by normalizing a thickness h of said interdigital transducer with a spacing λ between digits of said interdigital transducer.

2. A surface acoustic wave device according to claim 1, wherein:

said single crystal piezo-electric substrate has an orientation rotated by an angle in a range of 46°±0.3° from the Y-axis to the Z-axis about the X-axis.

3. A surface acoustic wave device according to claim 2, wherein:

said normalized thickness h/λ is approximately 9%.

4. Surface acoustic wave device according to claim 3, wherein said single crystal piezo-electric substrate exhibits a volume resistivity in a range of $3.6 \times 10^{10}$ to $1.5 \times 10^{14}$ Ω·cm.

5. A surface acoustic wave device according to claim 2, wherein said single crystal piezo-electric substrate exhibits a volume resistivity in a range of $3.6 \times 10^{10}$ to $1.5 \times 10^{14}$ Ω·cm.

6. A surface acoustic wave device according to claim 1, wherein:

said normalized thickness h/λ is approximately 9%.

7. A surface acoustic wave device according to claim 6, wherein said single crystal piezo-electric substrate exhibits a volume resistivity in a range of $3.6 \times 10^{10}$ to $1.5 \times 10^{14}$ Ω·cm.

8. A surface acoustic wave device according to claim 1, wherein said single crystal piezo-electric substrate exhibits a volume resistivity in a range of $3.6 \times 10^{10}$ to $1.5 \times 10^{14}$ Ω·cm.

* * * * *